United States Patent [19]

Knowles

[11] Patent Number: 5,205,997
[45] Date of Patent: Apr. 27, 1993

[54] AMPOULE FOR CRYSTAL GROWTH

[75] Inventor: Gregory W. Knowles, Lexington, Va.

[73] Assignee: Grumman Aerospace Corporation, Bethpage, N.Y.

[21] Appl. No.: 698,195

[22] Filed: May 6, 1991

Related U.S. Application Data

[63] Continuation of Ser. No. 387,197, Jul. 31, 1989, abandoned.

[51] Int. Cl.$^5$ ............................................. C30B 35/00
[52] U.S. Cl. ................................... 422/248; 422/245; 156/DIG. 62
[58] Field of Search ............... 422/245, 247, 250, 254; 423/290; 156/601, 616.1–616.4, 620.7, 620.72–620.76, DIG. 62; 164/122, 122.1, 122.2; 373/139, 140

[56] References Cited

U.S. PATENT DOCUMENTS

| | | | |
|---|---|---|---|
| 2,764,878 | 10/1956 | Hachmuth | 62/538 |
| 2,826,666 | 3/1958 | Cater | 156/616.3 |
| 2,839,366 | 6/1958 | Kamlet | 423/290 |
| 3,210,165 | 10/1965 | Van Run et al. | 156/616.3 |
| 3,290,891 | 12/1966 | De Lano, Jr. et al. | 62/534 |
| 3,414,387 | 12/1968 | Sysoev et al. | 156/616.41 |
| 3,473,894 | 10/1969 | Babl et al. | 423/290 |
| 3,592,628 | 7/1971 | Wuenscher | 422/133 |
| 3,647,578 | 3/1972 | Barnett et al. | 156/620.1 |
| 3,999,950 | 12/1976 | Nagorsen | 422/250 |
| 4,046,617 | 9/1977 | Fletcher et al. | 156/601 |
| 4,201,746 | 5/1980 | Burd et al. | 422/250 |
| 4,309,239 | 1/1982 | Rodot nee Fumeton | 156/601 |
| 4,591,410 | 5/1986 | Ziegler | 156/616.1 |
| 4,704,258 | 11/1987 | Hemmerdinger et al. | 422/254 |
| 4,740,264 | 4/1988 | Naumann et al. | 156/620.76 |
| 4,925,636 | 5/1990 | Hemmerdinger et al. | 422/248 |

FOREIGN PATENT DOCUMENTS 58-219733 12/1983 Japan.

OTHER PUBLICATIONS

Brice, J. C. "The Growth of Crystals from Liquids" North Holland Publishing, Amsterdam (1973) pp. 192–194.

Avduyevsky, et al., "Technological Experiments Aboard 'Salyut-5'", Acta Astronautica vol. 7, (Jul. 1980), pp. 867–876.

Witt, et al., "Crystal Growth and Segregation Under Zero Gravity; Ge" Journal of the Electrochemical Society: Solid State Science and Technology, Nov. 1978, vol. 125, No. 11, pp. 1832–1840.

Primary Examiner—R. Bruce Breneman
Attorney, Agent, or Firm—Pollock, VandeSande & Priddy

[57] ABSTRACT

An ampoule contains an ingot of non-monocrystalline material. A seed of the same material but monocrystalline in nature is embedded within the ingot. A spring biases a piston to retain the seed and ingot together, even in an environment with vibrational forces. When the ingot is melted, the piston contains all of the melted material within a volume free of empty space. Upon cooling the ingot solidifies to a monocrystalline mass.

2 Claims, 1 Drawing Sheet

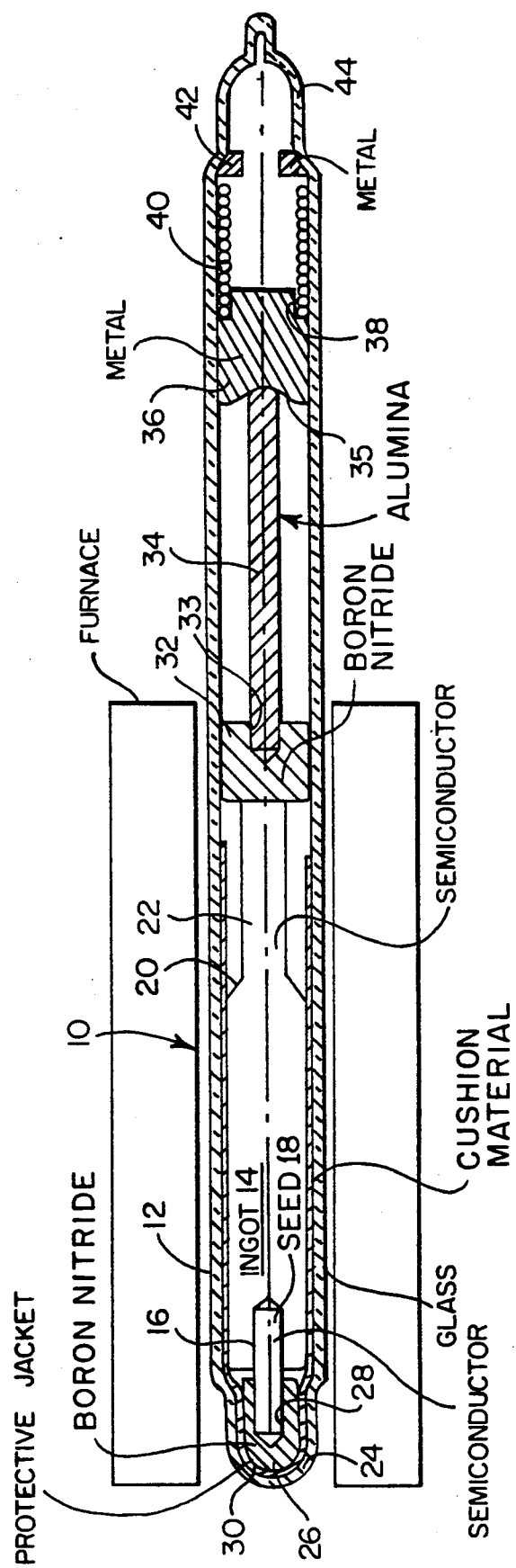

AMPOULE FOR CRYSTAL GROWTH

This application is a continuation of Ser. No. 07/387,197 filed on Jul. 31, 1989, now abandoned.

FIELD OF THE INVENTION

The present invention relates to apparatus for growing a semiconductor crystal, and more particularly to an ampoule construction for growing gallium arsenide monocrystalline ingots in space.

BACKGROUND OF THE INVENTION

An on-going activity of space exploration is the growth of pure monocrystalline ingots of material such as gallium arsenide. Traditionally, monocrystalline materials are formed by enclosing, within an ampoule, a seed of the monocrystalline material in contact with an ingot of the same material but which is non-monocrystalline. The ampoule is heated and the ingot is forced to melt while maintaining contact with the seed. Upon cooling, the melted material freezes progressively to form a monocrystalline structure.

A major disadvantage of present ampoules designed for space travel is their vulnerability to launch forces which frequently break parts of the ampoule. Further, it is difficult for the ampoule to be designed in such a way that the entire seed is not melted. This detracts from the efficiency of crystal growth as the melted ingot is cooled down, causing defects in the crystal lattice.

BRIEF DESCRIPTION OF THE INVENTION

The present invention is an improvement of the basic space-borne crystal growth ampoule. The utilization of a spring-biased plunger maintains the essential components of the ampoule in place during and after being exposed to launch forces. Further, the present invention utilizes a block of boron nitride for absorbing heat during the ingot melt cycle, thus assuring that part of the seed will not be melted. The construction of the present invention locates the spring in the coolest section of the ampoule where it will not be adversely affected by heat, thereby ensuring the proper operation of the spring.

The construction of the present invention greatly facilitates monocrystalline growth in microgravity of space.

BRIEF DESCRIPTION OF THE FIGURE

The above-mentioned objects and advantages of the present invention will be more clearly understood when considered in conjunction with the accompanying drawing, in which:

the FIGURE is a cross-sectional view of an ampoule in accordance with the present invention.

DETAILED DESCRIPTION OF THE INVENTION

The ampoule construction of the present invention is generally indicated by reference numeral 10 and is seen to include a quartz ampoule envelope 12 containing a generally cylindrical precast ingot 14 of crystalline material, such as gallium arsenide. The left illustrated end of the ingot has a bore 16 formed therein for receiving a generally cylindrical monocrystalline seed 18. If the ingot is composed of gallium arsenide, the seed will also be so composed. A median section 20 of the ingot is tapered downwardly to a stepped-down cylindrical section 22. The left end of the ampoule envelope 12 includes a bulbous projection 24 for receiving a similarly shaped chilling member fabricated from an appropriate material, such as boron nitride. The member includes a bore 28 for receiving the left end of seed 18. The ingot 14 and chilling member 26 are wrapped with a protective cushion material 30, such as beta cloth packing, ASTROQUARTZ, zirconia wool, or the like. This cushion material is interposed between the ampoule envelope 12 and the interior components described, so as to minimize the likelihood of breakage.

A piston 32 may also be fabricated from boron nitride. The left indicated surface bears against the outward end of cylindrical section 22. A bore 33 is formed in the opposite end of the piston for receiving a cast alumina rod 34. An opposite end of rod 34 is rounded and bears against the concave surface 35 of a boron nitride follower 36. In order to actuate piston 32, a compressed spring 40 has its left end section seated upon an extended neck 38 of follower 36. The spring is made from a material which retains its strength at a high temperature, such as Inconel or the like. An opposite end of the spring bears against metal shoulders 42, and as will be observed, the right end of the ampoule envelope 12 includes an outward bulbous portion 44.

In operation, when the ingot 14 has its original length, the coil spring 40 exerts a sufficient force on follower 36, rod 34, and piston 32 to maintain the ingot 14 in contact with seed 18. Spring force must be sufficient to maintain this contact during launch of a space vehicle. Once in space, the crystal growth cycle begins. Conventionally, an ampoule is placed within a small gradient heat furnace; and with the present inventive ampoule, the traveling melt gradient will begin in the area of piston 32 and proceed toward the chill member 26. As the melt progresses, the step-down cylindrical section 22 of the ingot is progressively melted, allowing the piston 32 to advance toward the left. When the space to the left of the ingot is filled with melt, it becomes pressurized by the piston, but at a low pressure owing to the lessened spring force exerted by an expanded spring. In this way leakage of melt past the piston 32 is minimized. The traveling melt continues to the left end of ingot 14, at which point only part of seed 18 becomes melted. The ingot is now allowed to cool. The piston 32 has a light force exerted thereagainst by spring 40 and this allows for expansion of the solidifying crystal ingot 14. A light pressure is maintainable through the solidification process since the right illustrated cylindrical section 22 becomes joined with the main volume of ingot 14 upon melting; and accordingly, the piston 32 will finish at a point displaced to the left of its original position where the spring force is kept at a decreased value.

It will be noted that the compressed spring 40 is positioned opposite from the zone of the traveling melt. This helps to maintain the spring in the coolest zone within the ampoule where it will not be unduly softened by heat exposure.

An additional advantage of the present design is that the spring is strongly compressed prior to commencement of the traveling melt cycle and thereby keeps all points in firm contact and, hence, resistant to space vehicle launch loads. Yet during the solidification cycle, the spring becomes extended and applies a commensurately decreased light force to the melt.

By utilizing a block of boron nitride as a chilling member 26, the enclosed gallium arsenide seed 18 absorbs heat during the melt cycle thereby ensuring that a part of the seed will not be melted and thus efficient solidification of a monocrystalline structure can be effected.

It should be understood that the invention is not limited to the exact details of construction shown and described herein for obvious modifications will occur to persons skilled in the art.

I claim:

1. An ampoule for growing monocrystalline structures comprising:

a generally cylindrically shaped sealed envelope;

a generally cylindrically shaped non-monocrystalline ingot contained within the envelope, the ingot having a first section stepping down to a second section, a portion of a first section outer surface in contact with an inner envelope wall surface;

a piston located in the envelope and bearing directly against an outward end of the ingot second section;

a rod connected at a first end thereof to the piston and movable together therewith, the rod extending away from the ingot;

a monocrystalline seed of the same material received within one end of the ingot;

a strongly compressed spring biasing the piston against the ingot for maintaining contact between the seed and the ingot in response to anticipated vibrational forces while the ingot is in an original solid state;

the length of the stepped down ingot section being sufficiently long to permit expansion of the spring when the material is melted and thus shortened to precisely contain the melted material in the envelope volume bounded by the piston, the melted material being newly configured to a uniform cross section;

the expanded spring having a decreased compression force to minimize leakage past the piston when the ingot is in a melted state.

2. An ampoule for growing monocrystalline structure comprising:

a generally cylindrically shaped sealed quartz envelope;

a generally cylindrically shaped non-monocrystalline ingot of gallium arsenide contained within the envelope, the ingot having a first cylindrical section stepping down to a second cylindrical section of smaller diameter, a portion of a first section outer surface in contact with an inner envelope wall surface;

a piston located in the envelope and bearing directly against an outward end of the ingot second section;

a rod connected at a first end thereof to the piston and movable together therewith, the rod extending away from the ingot;

a seed of monocrystalline gallium arsenide partially received within an end of the ingot opposite the piston contacting end;

a cap of boron nitride located at an end of the envelope and receiving a free end of the seed, the cap absorbing heat during melting of the ingot to ensure that the entire seed is not melted;

a spring strongly compressed and biasing the piston against the ingot for maintaining contact between the parts within the envelope in response to anticipated vibrational forces while the ingot is in an original solid state;

the length of the stepped down ingot section being sufficiently long to permit expansion of the spring when the material is melted and thus shortened to precisely contain the melted material in the envelope volume bounded by the piston, the melted material being newly configured to a uniform cross section;

the expanded spring having a decreased compression force to minimize leakage past the piston when the ingot is in a melted state.

* * * * *